(12) United States Patent
Lambiaso

(10) Patent No.: US 6,527,227 B1
(45) Date of Patent: Mar. 4, 2003

(54) STORAGE COMPARTMENT WITH UNIVERSAL MOUNTING CAPABILITY

(75) Inventor: Guy A. Lambiaso, Garden Grove, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 09/931,568

(22) Filed: Aug. 16, 2001

(51) Int. Cl.$^7$ ............................................. B64D 47/00
(52) U.S. Cl. ................. 244/118.1; 248/228.5; 248/229.14
(58) Field of Search .................. 244/1 R, 117, 244/118.1, 118.2; 454/184, 76; 361/678, 695; 248/638, 229.1, 229.14, 228.1, 228.5

(56) References Cited

U.S. PATENT DOCUMENTS

| | | | |
|---|---|---|---|
| 2,156,827 A | * | 5/1939 | Wehr ......................... 104/111 |
| 2,846,169 A | * | 8/1958 | Sullivan ................ 248/229.14 |
| 2,994,937 A | * | 8/1961 | Williams ................. 248/228.1 |
| 4,133,507 A | | 1/1979 | Chervenak |
| 4,153,225 A | * | 5/1979 | Paulsen .................... 244/118.1 |
| 5,021,763 A | * | 6/1991 | Obear ..................... 361/695 X |
| 5,050,832 A | | 9/1991 | Lee et al. |
| 5,526,235 A | | 6/1996 | Beason et al. |
| 5,621,387 A | | 4/1997 | Phillips et al. |
| 5,907,476 A | | 5/1999 | Davidszq |
| 6,005,957 A | * | 12/1999 | Meeks ........................ 181/171 |
| 6,120,000 A | | 9/2000 | Aeschbach et al. |
| 6,289,678 B1 | * | 9/2001 | Pandolfi ..................... 361/687 |

* cited by examiner

Primary Examiner—Harold Joyce
(74) Attorney, Agent, or Firm—Harness Dickey & Pierce P.L.C.

(57) ABSTRACT

A storage compartment used for storing modules in a cargo bay, whereby the compartment attaches to the support structure of an aircraft cargo bay. The storage compartment comprises a housing defining an interior space, an air flow opening and an access opening. First and second mounting member are secured to the entire width or length one of the walls and spaced apart and parallel from one another. Brackets attach the mounting member to the equipment bay support structure. Further, a panel serves as an access opening to the storage compartment. Inside the equipment bay, an interior shelf, supports the modules stored in compartment and facilitates cooling beneath the modules. Fans mounted on the compartment further facilitate cooling. Vibration-absorbing material, mounted to the shelf, further provides shock-absorbing support to the modules.

11 Claims, 4 Drawing Sheets

STORAGE COMPARTMENT WITH UNIVERSAL MOUNTING CAPABILITY

FIELD OF THE INVENTION

This invention relates to a storage compartment, and more particularly to a storage compartment that universally mounts to the internal support structure of an aircraft cargo bay allowing placement of the storage compartment at any location within an aircraft cargo bay regardless of the differing support structures in an aircraft.

BACKGROUND OF THE INVENTION

Storage compartments are used in various applications to enclose, store, mount or support devices, objects, or things to be mounted or placed in a variety of vehicle storage locations. In applications where the storage compartment must be secured against movement, previous storage compartments suffer from the increased tooling time and labor costs required to secure the compartment against movement while the vehicle is in motion. Because support structures vary from vehicle to vehicle, model to model, or even in the same vehicle, the need to retool a particular storage compartment or create fittings to secure a particular storage compartment increases installation time and expense.

The lack of uniformity in mounting storage compartments results in a storage compartment having increased parts in order to mount the storage compartment to any location on the support structure of a vehicle without additional parts at the point of install. The differing support structures in vehicles require that storage compartments come with a vast assortment of mounting brackets and fittings, of which many will not be used, to ensure that the storage compartment will successfully mount to the vehicle support structure. Further, many applications require a record of the installation process so that it may be referenced in some point in the future. Recordation of the process, when the installation process could vary with the use of many parts, becomes a lengthy and expensive endeavor.

SUMMARY OF THE INVENTION

The above and other objects are provided by a storage compartment in accordance with the preferred embodiments of the present invention. The storage compartment of the present invention universally mounts to a wide range of support structures of a commercial aircraft. As such, further design work, re-tooling, and additional parts are not required to mount the storage compartment to the support structure of an aircraft. Reduction of the aircraft vehicle design work and per aircraft parts reduces overall cost by reducing complexity and overall number of parts in tandem with a reduction in paper due to harmonization of the installation process over multiple aircraft.

The storage compartment of the present invention makes use of brackets designed to attach to the support structure of an aircraft on one end and attach to the mounting members of storage compartment on the other. Locations, where the brackets and mounting members are a secured to each other, are infinitely variable allowing the storage compartment to accommodate drastic changes in support structure shape and layout. Further, the mounting members can be secured to the storage compartment in many different ways to facilitate attaching the brackets to mounting members and aircraft support structures.

In the preferred embodiments, fans and cooling airflow openings are located at many locations on the walls of the storage compartment to facilitate cooling. Further, an interior shelf with vibration absorbing material is secured in the interior space of the storage compartment. Modules of various shape and function can be installed on the interior shelf of the storage compartment. When cooling demands of the modules necessitate more cooling, a cooling duct can be attached to the airflow openings and connected to a cooling unit in the aircraft.

In the preferred embodiments, the brackets are attached to the bottom flange of an aircraft support structure, where the support structure generally takes the shape of an I-Beam. The brackets attach to the mounting members and the bottom flange using threaded fasteners, nut plates, and radius blocks. By drilling holes in the support structure of an aircraft in anticipation of assembly, the brackets and mounting members can be assembled at the point of install in any arrangement to facilitate differing or even non-constant support structure configurations. The ability to assemble the brackets to the mounting members in many different arrangements enables the storage compartment to be mounted in many locations.

BRIEF DESCRIPTION OF THE DRAWINGS

The various advantages of the present invention will become apparent to one skilled in the art by reading the following specification and claims and by referencing the following drawings in which:

DETAILED DESCRIPTION OF THE PREFERRED EMBODIMENTS

Figure 1:
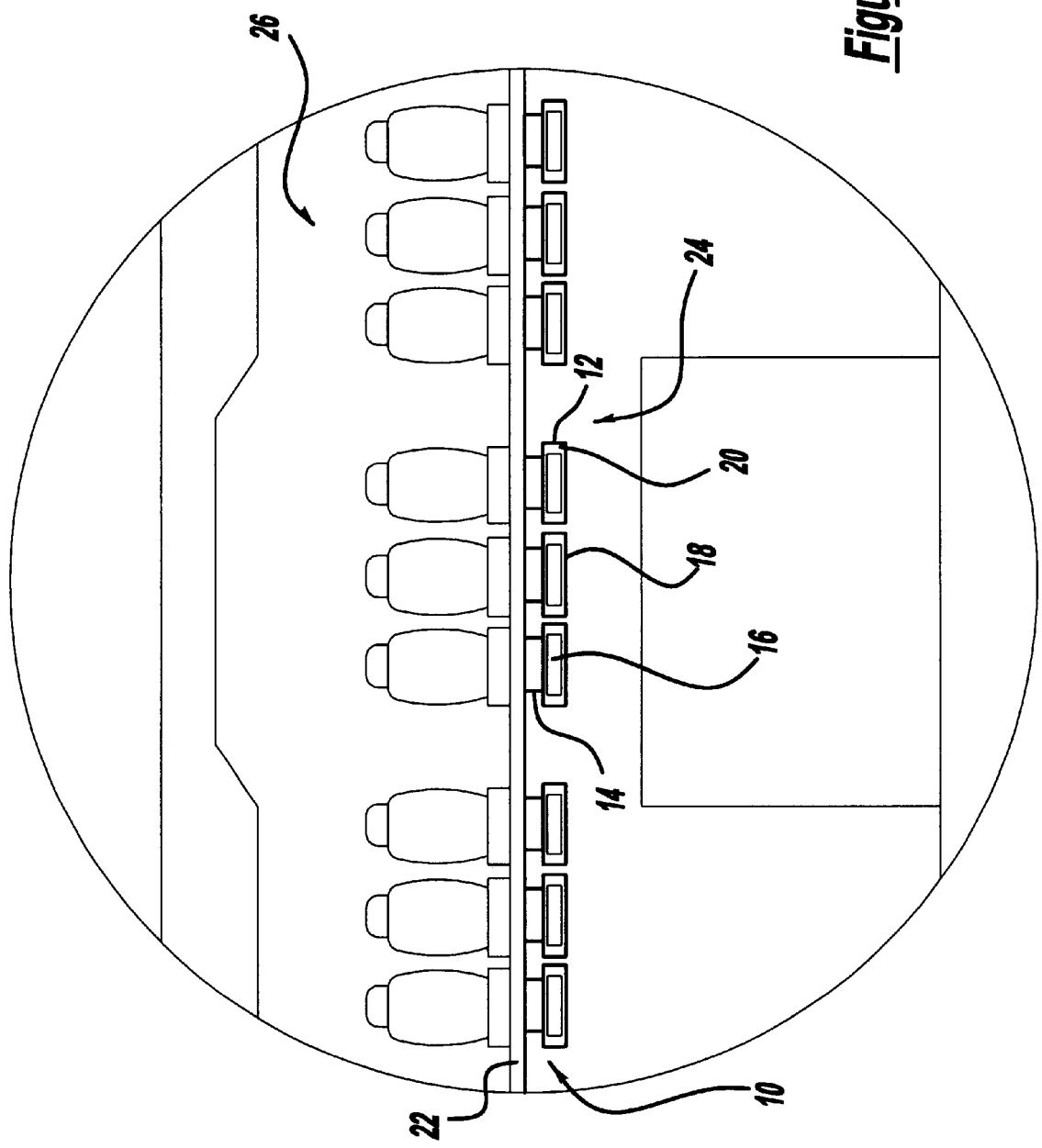
FIG. 1 is an environmental front view of the storage container in accordance with a preferred embodiment of the present invention, with the storage compartment of the present invention secured to an aircraft support structure.

Referring to FIG. 1, there is shown a storage compartment 10 in accordance with a preferred embodiment of the present invention. The storage compartment 10 includes a housing 12 and mounting assembly 14 for housing a module 16. The housing 12 includes walls 18 that define an interior space 20. The housing 12 is attached to a support structure 22 (i.e., an I-beam) of an airplane cargo bay 24 via the mounting assembly 14.

In a preferred embodiment of the invention the storage compartment 10 is installed in the cargo bay area of an aircraft. The ceiling of the cargo bay 24 is lined with a cargo bay liner (not shown). Beneath the liner and between the cargo bay 24 and the passenger compartment 26 are structural components of the airplane that serve as the support structure 22 to which the storage compartment 10 is mounted. In most instances these structural components take the form of modified I-Beams. The I-Beam structures run the length of the aircraft. The spacing, however, is quite different from aircraft to aircraft and even within the same aircraft depending on the location of the storage compartment. Further, some aircraft have discontinuous I-beam structures. In a preferred embodiment, the storage compartment 10 is attached to the support structure 22 in the aft of the cargo hold abutting the aft bulkhead. One skilled in the art will realize the storage compartment 10 can be mounted to many locations in the aircraft and is not limited to the aft cargo hold area abutting the aft bulkhead.

Figure 2:
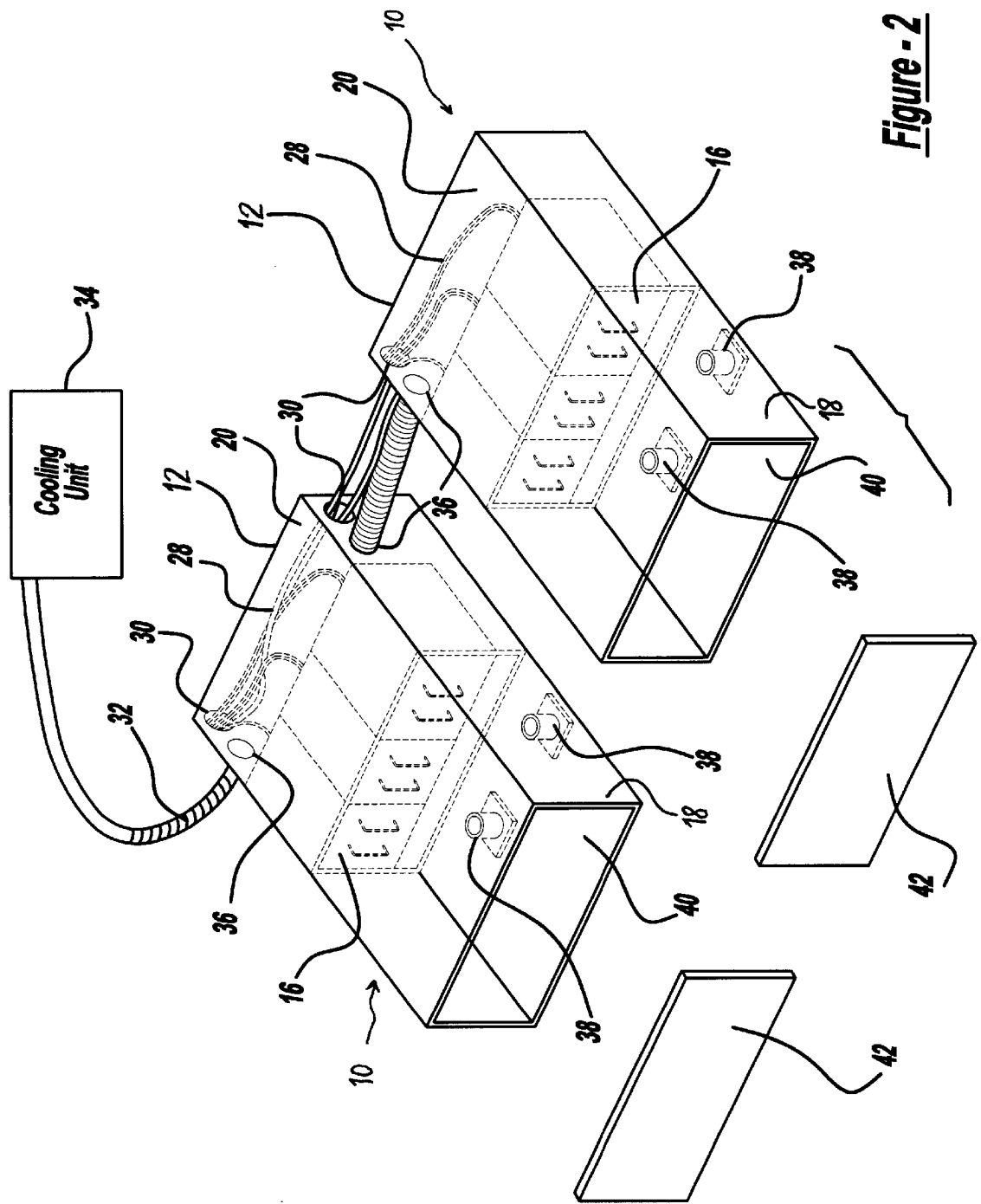
FIG. 2 is a perspective view of two storage containers in accordance with another preferred embodiment of the present invention, with the storage compartments disposed side by side with modules and electrical connections installed.

Referring to FIG. 2, a pair of storage compartments 10 in accordance with an alternative preferred embodiment of the present invention are shown. Each storage compartment 10 includes at least one module 16. From each module 16, electrical connections 28 exit the housing 12 through a wiring opening 30. In addition, air duct 32, preferably attached to a cooling unit 34 of the vehicle (not shown), provides a cooling air flow to interior space 20 through airflow opening 36. Cooling fans 36, secured in an airflow opening 36, provide additional cooling to the interior space 20 of the storage compartment 10. One skilled in the art will realize cooling fan placement and quantity will be generally dictated by cooling concerns; as such the invention is not limited to two cooling fans 36 per storage compartment 10.

Further referring to FIG. 2, storage compartment 10 includes an access opening 40 in walls 18 where an access panel 42 is removably secured. One skilled in the art will readily ascertain the access panel 42 need not be secured to allow operation of module 16 in storage compartment 10; therefore, the present invention is not limited to the panel 42 secured to the access opening 40 of storage compartment 10.

Further referring to FIG. 2, module 16 in a preferred embodiment of the present invention are computers adapted to provide wireless Ethernet communication within the aircraft. Storage compartments 10 mounted beneath the passenger compartment 26 provide wireless Ethernet services to the passengers while traveling to their destination. One skilled in the art will appreciate that many configurations are possible beyond the one shown in FIG. 2, such that a single computer or multiple computer with multiple storage compartments could be used.

Figure 3:
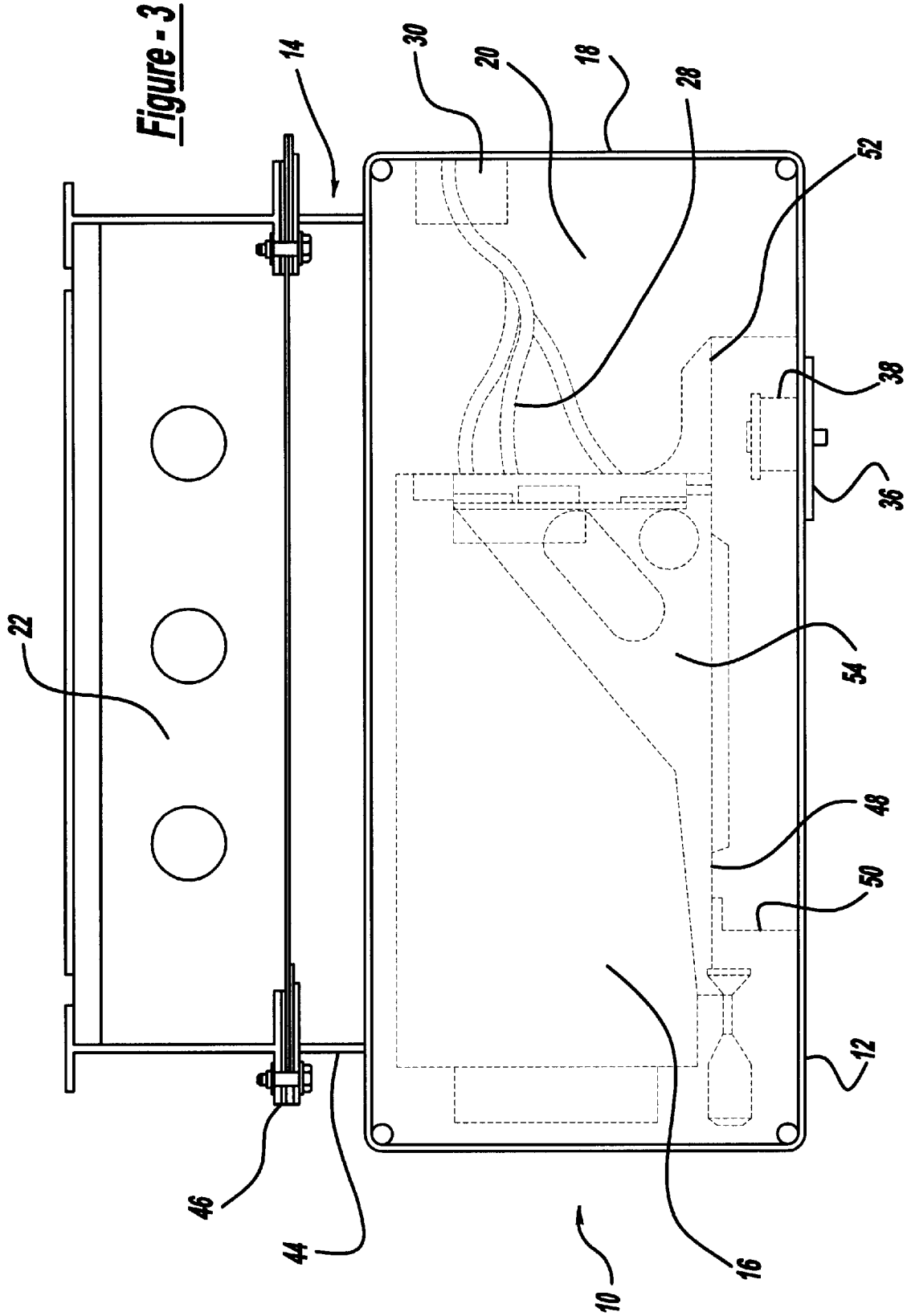
FIG. 3 is a sectional side view of the storage container in accordance with a preferred embodiment of the present invention, with the storage compartment of the present invention secured to a vehicle support structure.

Referring to FIG. 3, the mounting assembly 14 connected to support structure 22 and storage compartment 10 in accordance with a preferred embodiment of the present invention is shown. The mounting assembly 14 includes mounting members 44 and brackets 46, shown and described later in FIG. 4. Where the walls 18 of housing 12 attach to the mounting member 44, the mounting member 44 attaches to bracket 46, and the bracket 46 is supported by the support structure 22.

Further referring to FIG. 3, the storage compartment 10 further includes a cooling fan 38 placed in an air flow opening 36 through the housing 12. Also, the storage compartment 10 includes an interior shelf 48, supported by the housing 12 via shelf supports 50, upon which the module 16 is supported. Interposed between housing 12 and interior shelf 48 is a vibration absorbing member 52. Preferably, the vibration absorbing member 52 is positioned between module 16 and the interior shelf 48.

Further referring to FIG. 3, an ARINC™ tray 54 adapted to support and supply power and data to module 12 is shown in accordance with a preferred embodiment of the present invention. An ARINC™ tray 54, or the like, provides for a secure harness for the module 12, while further providing quick connections for data and power. A suitable structure for use with the present invention is commonly available for AT&T/Claircom. One skilled in the art would readily ascertain storage compartment 10 is not limited to use of an ARINC™ tray 54, but storage compartment 10 can be used with many trays that provide support to computer and other electronics; therefore, the present invention is not limited to the use of an ARINC™ tray.

In an alternative preferred embodiment of the invention the storage compartment 10 can be mounted to the support structure of the mobile platform using only one mounting member. When only one mounting member is used the opposite side of the storage compartment can be affixed to other locations in the aircraft such as bulkheads, cargo area structural members, and other adequate structural locations.

Figure 4:
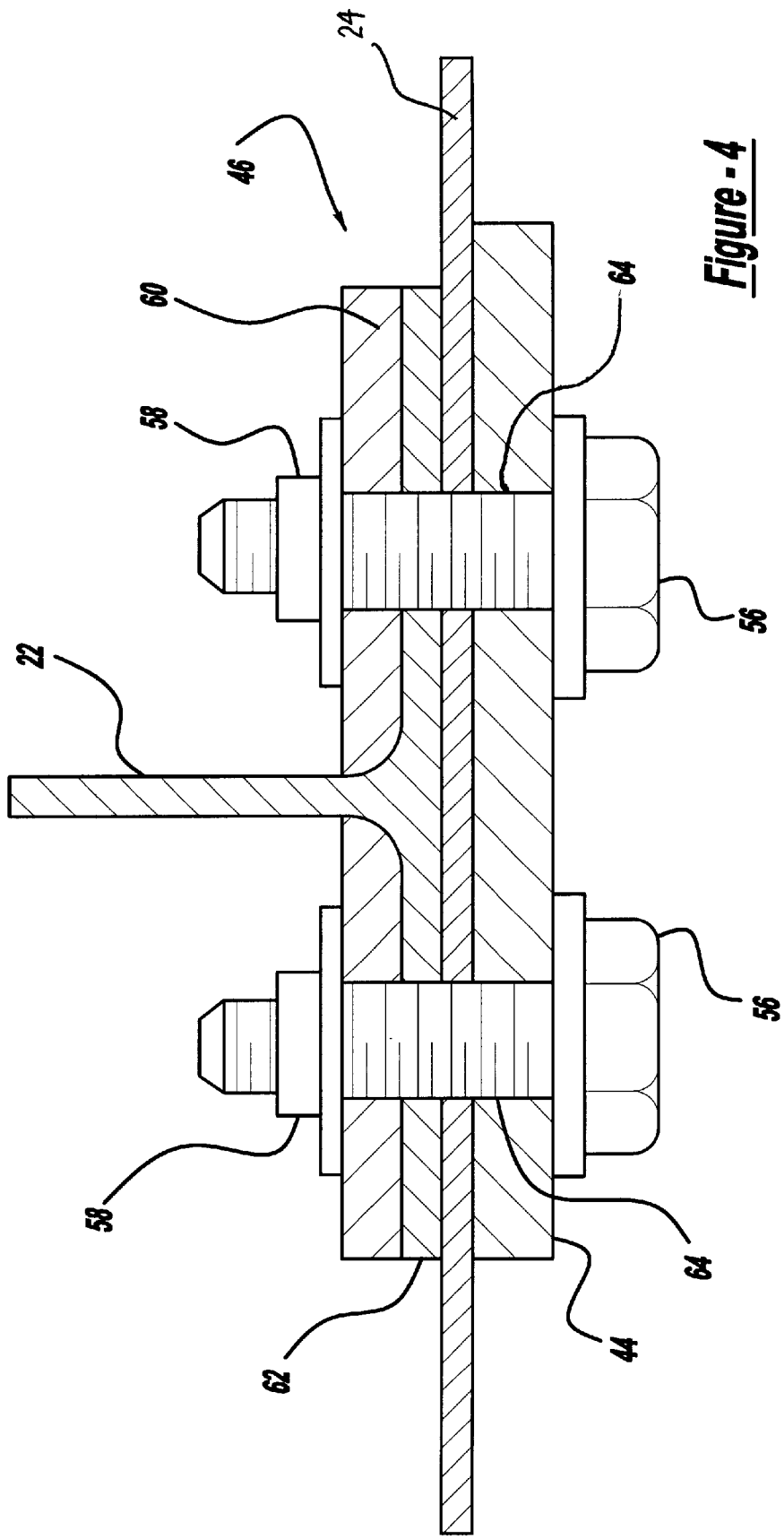
FIG. 4 is a partial sectional view of the bracket of the storage container in accordance with a preferred embodiment of the present invention, with the bracket of the storage compartment shown installed to the bottom of a support structure.

Referring to FIG. 4, the bracket 46 of the mounting assembly 14 is attached to a bottom flange 62 of the support structure 22. The bracket 46 includes a pair of bolts 56, as well as complementary nut plates 58 and radius blocks 60. In securing the bracket 46 to the bottom flange 62 of the support structure 22, the mounting member 44 is secured to the bottom flange portion 62 of the support structure 22 by threading bolts 56 through aligned apertures 64 of the mounting member 44, in the ceiling of the cargo hold 24, the bottom flange 62, the radius blocks 60 and the nut plates 58. Then tightening nut plates 58 on respective bolts 56 with mounting member 44, bottom flange 62, and radius blocks 60 secured therebetween. To accommodate the differing placements of the modified I-Beam structures in aircraft cargo bays the mounting members can be drilled at the point of install, thereby allowing the compartment to be installed at any point in the aircraft without the need for additional parts or tools.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A storage compartment for use in storing a module in an equipment bay of a mobile platform having a support structure, said storage compartment comprising:
   a housing including walls defining an interior space and adapted to support the module in said interior space;
   at least one mounting member secured to at least one of said walls of said housing and substantially extending along a width or length of said one of said walls;
   at least one bracket adapted to attach to the support structure and secure said housing to the support structure; and
   an air flow opening in said housing and a fan positioned in said air flow opening to provide a cooling airflow to said housing.

2. A storage compartment as in claim 1, wherein said housing includes an access opening, said storage compartment further comprising a panel removably secured to said housing to selectively close said access opening.

3. A storage compartment as in claim 1, wherein said at least one mounting member includes a first and a second mounting member disposed spaced apart and generally parallel to one another.

4. A storage compartment as in claim 3, wherein said at least one bracket is a plurality of brackets adapted to attach to the support structure, each of said plurality of brackets matingly secured to one of said first and second mounting members.

5. A storage compartment for use in storing at least one module in a fuselage of an aircraft having a support structure, said storage compartment comprising:

a housing including walls defining an interior space and adapted to support the at least one module in said interior space;

a first mounting member secured to one of said walls of said housing and generally extending along an entire width or length of a planar surface;

a second mounting member secured to said one of said walls of said housing, generally extending along said entire width or length of said one of said walls, and disposed spaced apart and generally parallel to said first mounting member;

at least one bracket adapted to attach to the support structure and secure said housing to the support structure;

an interior shelf supported by said housing and disposed a distance from said walls of said housing, said shelf adapted to support said at least one module; and an air flow opening in said housing and a fan positioned in said air flow opening to provide a cooling airflow to said housing.

6. A storage compartment as in claim 5, wherein said housing includes an access opening, said storage compartment further comprising a panel removably secured to said housing to selectively close said access opening.

7. A storage compartment as in claim 5, further comprising:

a vibration absorbing member between said interior shelf and said housing to dampen vibration to said at least one module in said housing.

8. A storage compartment as in claim 5, wherein said at least one bracket is a plurality of brackets adapted to the support structure, each of said plurality of brackets matingly secured to one of said first and second mounting members.

9. A storage compartment as in claim 5, further comprising:

electrical connections secured to said interior shelf adapted to provide power and data communication with said module.

10. A storage compartment as in claim 5, wherein said at least one bracket secures to said at least one mounting member in a plurality of locations, said plurality of locations adapted to accommodate differing said support structures.

11. A storage compartment for use in storing at least one module in an aircraft cargo bay having a support structure, said storage compartment comprising:

a housing including walls defining an interior space, an air flow opening and an access opening, said housing adapted to support the at least one module in said interior space;

a first mounting member secured to at least one of said walls of said housing and generally extending along an entire width or length of said one of said walls;

a second mounting member secured to at least one of said walls of said housing, generally extending along said entire width or length of said one of said walls, and disposed spaced apart and generally parallel to said first mounting member;

at least one bracket adapted to attach to the support structure and secure said housing to the support structure;

a panel removably secured to said housing to at least selectively close said access opening;

an interior shelf supported by said housing and disposed a distance from said walls of said housing, said shelf adapted to support said at least one module;

a fan positioned in said air flow opening in said housing to provide a cooling airflow to said housing; and a vibration absorbing member between said interior shelf and said housing to dampen vibration to said at least one module in said housing;

said plurality of brackets adapted to attach to the support structure, each of said plurality of brackets matingly secured to one of said first and second mounting members.

* * * * *